United States Patent [19]

Kucharewski et al.

[11] 4,286,233
[45] Aug. 25, 1981

[54] GATED OSCILLATOR

[75] Inventors: Nicholas Kucharewski, Lebanon; James E. Gillberg, N. Plainfield, both of N.J.

[73] Assignee: RCA Corporation, New York, N.Y.

[21] Appl. No.: 55,975

[22] Filed: Jul. 9, 1979

[51] Int. Cl.³ .............................................. H03K 3/26
[52] U.S. Cl. ................... 331/111; 331/108 R
[58] Field of Search ............... 331/111, 57, 113 R, 331/108; 307/223 R, 223 C

[56] References Cited

U.S. PATENT DOCUMENTS

| | | | |
|---|---|---|---|
| 3,851,277 | 11/1974 | Suzuki et al. | 331/113 R |
| 3,878,483 | 4/1975 | Richardson | 331/111 |
| 3,914,711 | 10/1975 | Carlson et al. | 331/111 |
| 4,039,973 | 8/1977 | Yamashiro | 331/111 |
| 4,058,777 | 11/1977 | Kuwabara et al. | 331/111 |
| 4,058,777 | 11/1977 | Kuwabara et al. | 331/57 |
| 4,095,194 | 6/1978 | Hoehn et al. | 331/111 |

OTHER PUBLICATIONS

Paradise, J., "Using the CD4047A in COS/MOS Timing", Applications RCA Solid State Division, ICA-N-6230, 2/74.

Primary Examiner—David K. Moore
Attorney, Agent, or Firm—E. P. Herrmann; Allan J. Jacobson

[57] ABSTRACT

A gated oscillator implemented with cascade-connected inverting logic circuits and resistor-capacitor timing elements generates oscillations so long as an inhibiting signal is not applied to one of the logic circuits. Means are provided to maintain potentials on the timing elements during application of inhibiting signal, which potentials are equivalent to steady-state operating potentials at the inception of a state transition. When the inhibiting signal is discontinued allowing oscillations to be generated, the initial pulse period is equal to the steady-state pulse period.

23 Claims, 8 Drawing Figures

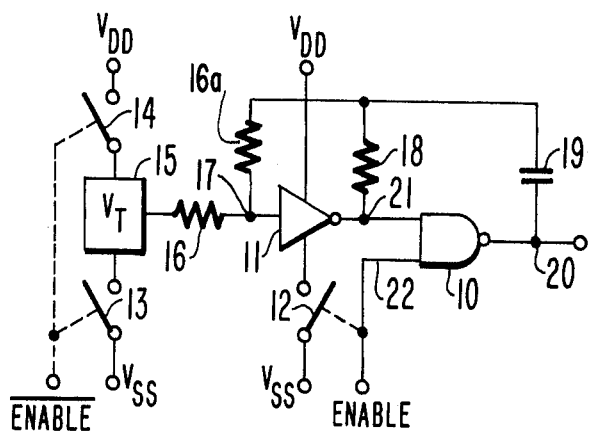
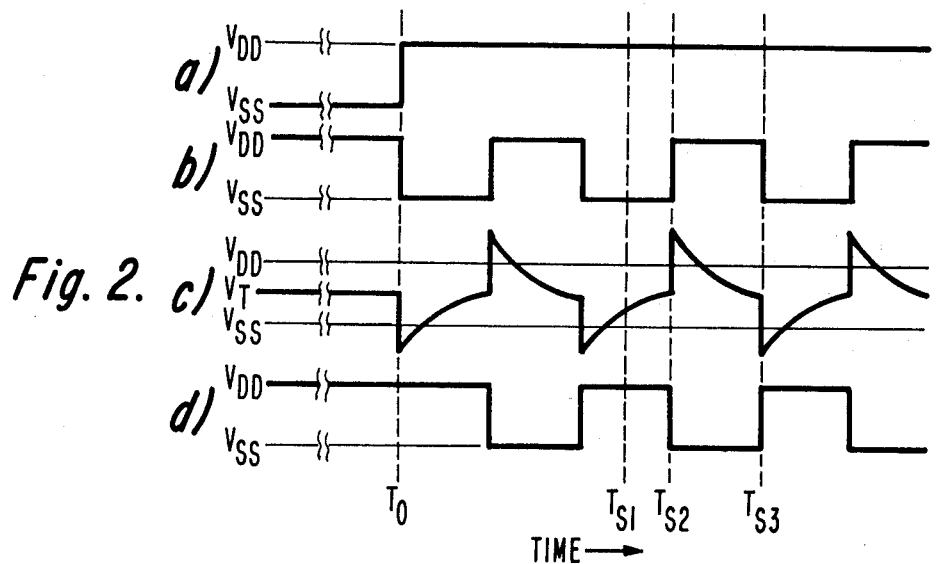
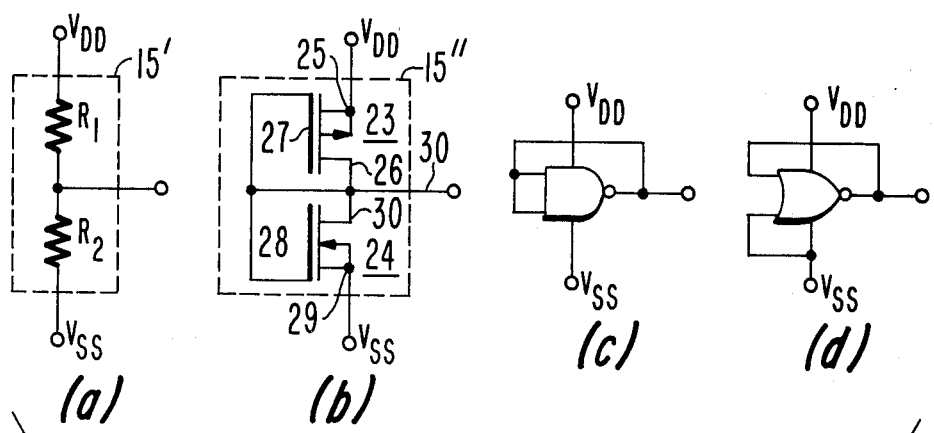
Fig. 1.
Fig. 2.
Fig. 3.

GATED OSCILLATOR

This invention relates to gated oscillator circuits, in particular to those of a sort implemented with logic circuits, advantageous in that the initial pulse period is substantially identical to the steady-state pulse period.

Gated oscillator circuits, implemented with logic circuits, typically include a plurality of inverting circuits connected in cascade and having a feedback circuit comprising a capacitor connected between the output terminal of the latter most inverting circuit and the input terminal of the first. In addition, a timing resistor is connected between the input terminal, and the output connection of one of the cascade connected inverting circuits which normally operates in a state complementary to the latter-most inverting circuit. At least one of the inverting circuits is a NAND or NOR circuit having an independent input terminal by which the oscillatory mode of the circuit may be inhibited by application of the appropriate logic signal thereto.

In operation, the first of the cascade-connected inverting circuits alternates between states responsive to the potential at the interconnection of the resistor and capacitor traversing a threshold level. The threshold level is determined by the input voltage at which the inverting circuit changes state and for symmetrical circuits such as the RCA CD4007 COS/MOS INVERTER, is midway between the supply potentials. The threshold potential establishes the steady-state d-c voltage upon which the output signal from the latter-most inverting circuit, as applied via the capacitor, is superimposed. Since the resistor is connected to a potential logically complementary to the output potential, the potential is symmetrically changed by charging or discharging the capacitor to obtain both positive and negative excursions about the threshold potential.

Gating the oscillator to inhibit its operation affects the d-c potential at the resistor-capacitor interconnection. For the typical circuit the interconnection will charge through the resistor to either supply potential or reference which potentials are significantly different from the threshold potential. Thus when the circuit is enabled the first pulse period is extended or contracted by the resistor-capacitor interconnection being restored to the steady-state d-c voltage, i.e., the charging (discharging) of the interconnection is substantially different from the symmetrical steady-state operation.

In the present invention the gated oscillator produces a first pulse period substantially identical to the steady-state pulse period by selectively applying a potential equivalent to the threshold potential to the resistor-capacitor interconnection, whenever operation of the oscillator is being inhibited, so that steady-state conditions are present at inception of the first pulse.

In the drawings:

FIGS. 1, 4–6 and 8 are schematic diagrams of gated oscillator circuits embodying the present invention;

FIG. 2 is a time-voltage graph of the node voltages for the FIG. 1 circuit;

FIGS. 3A, 3B, 3C, 3D are schematic diagrams of four circuits for generating a potential $V_T$.

Figure 4:
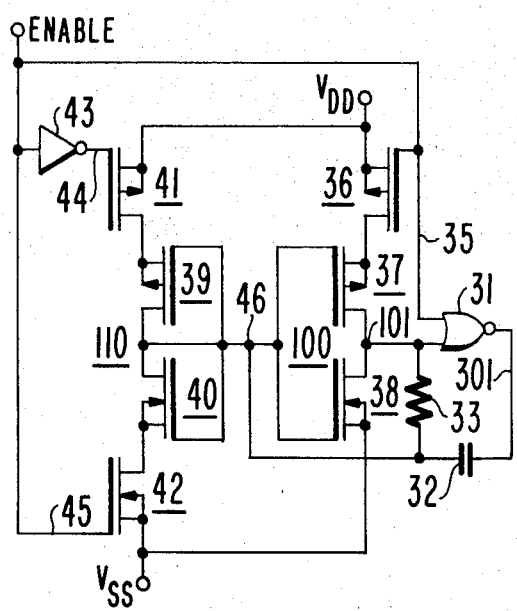

In FIG. 1, the combination of INVERTER 11 cascaded with two-input NAND circuit 10 and provided with feedback capacitor 19 and timing resistor 18 between output connection 20 and INVERTER input 17, comprises a basic gated oscillator conditioned to oscillate by application of a "high" logic signal to ENABLE input 22. The circuit 15, responsive to closure of switches 13 and 14 under the control of the $\overline{\text{ENABLE}}$ signal, selectively generates a d-c potential $V_T$ substantially equal to the potential at which INVERTER 11 will change states.

This potential is applied via resistors 16 and 16a to the interconnection of resistor 18 and capacitor 19, maintaining the potential at this point substantially at its steady-state value while oscillation is inhibited.

Switch 12, normally closed for the oscillator enabled and open for the oscillator inhibited, is interposed between INVERTER 11 and supply potential $V_{SS}$. This conditions the input potential to node 21 to a logic "high" in the inhibit stage, which in turn conditions NAND 10 to change states immediately after an ENABLE signal. NAND 10 having respective input connections 21 and 22 exhibits a "high" output signal for either or both input signals logically "low", and exhibits a logic "low" output signal otherwise. During an inhibit cycle, ENABLE is "low" and connection 21 is "high", consequently output 20 is "high". An ENABLE transition from "low" to "high" results in both NAND input connections being "high", initiating an output transition from "high" to "low".

The waveforms of FIG. 2 describe the operation of the FIG. 1 oscillator circuit. Waveforms b, c and d correspond to the voltages at nodes 20, 17 and 21 respectively, and waveform a, is the control or ENABLE signal at input connection 22. In the steady state, e.g., at $T_{S1}$, the output of NAND 10 is at a logic "low" and the output of INVERTER 11 is at a logic high. The plate of capacitor 19 connected to the node 17 is relatively negative and charging toward supply potential $V_{DD}$ via resistor 18. When node 17 charges to the positive switching or threshold voltage of INVERTER 11, i.e., at $T_{S2}$, the output of 11 changes state from "high" to "low", conditioning NAND 10 to switch from "low" to "high" output potential. The output transition of NAND 10 induces a potential increment of $(V_{DD}-V_{SS})$ onto node 17 via capacitor 19. Node 17 begins discharging toward $V_{SS}$ through resistor 18 until it reaches the negative threshold of the INVERTER 11 at time $T_{S3}$, causing it to again change state. In this manner the circuit alternates between states until the input 22 to NAND 10 is held "low" forcing the output of NAND 10 to a constant "high" state.

Concurrently with the imposition of the "low" or inhibit state at the ENABLE connection 22, switch 12 is opened and switches 13 and 14 are closed. Opening switch 12 disconnects INVERTER 11 from the relatively negative supply allowing the output of 11 to tend toward $V_{DD}$. Closing switches 13 and 14 applies supply potential to the potential generating circuit 15, typically a potential divider, which circuit generates a potential substantially equivalent to the negative threshold voltage of INVERTER 11. This potential is applied to the interconnection 17 of resistor 18 and capacitor 19 by resistor 16. Thus at the occurrence of an ENABLE signal at time $T_o$, the condition of the circuit is substantially identical to its steady-state condition for a first transition caused by the ENABLE signal, i.e., the node potentials at time $T_o$ are similar to those at time $T_{S3}$. Operating with circuit conditions identical to steady-state conditions, the oscillator responds during a first pulse period similarly to responses in the steady state.

Therefore, the first pulse period is identical in duration to a steady state pulse period.

The potential generated by circuit 15 for the FIG. 1 oscillator is arranged to be equal to the negative threshold potential of INVERTER 11. This is the input potential below which the INVERTER 11 will exhibit a "high" output. Were NAND 10 replaced by a NOR circuit as in FIG. 4, the circuit 15 would be arranged to generate a potential equivalent to the positive threshold potential of the inverter. This is a consequence of requiring the NOR to switch from "low" to "high" with imposition of an ENABLE signal, rather than from "high" to "low" as with the NAND. On the other hand, for a totally symmetrical INVERTER circuit (e.g., a CMOS or COS/MOS inverter) the positive and negative thresholds coincide and the threshold potential would be midway between supply potentials $V_{DD}$ and $V_{SS}$.

Opening switches 13 and 14 concurrently with imposition of the ENABLE signal detaches circuit 15 from the supply potential and severs all d-c loops between circuit 15 and the oscillator per se. Thus 15 is effectively disconnected from the oscillator circuit during the oscillating mode and has substantially no effect on its steady-state operating characteristic.

The FIG. 3A circuit shows one means of generating the threshold potential $V_T$ where the value of the potential to be generated is known. In this case $V_T = (R2\ V_{DD} + R1\ V_{SS})/(R1 + R2)$ where R1 and R2 are the resistance values of resistors R1 and R2 respectively.

For the situation where the threshold potential is not known with sufficient accuracy, the potential may be generated with a circuit which emulates the inverting circuit 11. Thus for a symmetrical INVERTER 11 a similar symmetrical inverter having its input and output terminals interconnected will generate the symmetrical switching point. FIG. 3B illustrates one such circuit. P-channel, 23, and n-channel, 24, field effect transistors have their respective drain electrodes 26 and 30 interconnected at 30 to form an output connection. The source electrodes 25 and 29 of the p- and n-channel transistors respectively arranged for receiving relatively positive and relatively negative supply potential configure the transistors as a complementary inverter pair for their gate electrodes 27 and 28 interconnected. Interconnecting their gate electrodes with the drain electrodes conditions the inverter circuit to operate with an output potential equivalent to its threshold or switching potential.

The FIGS. 3C and 3D circuits are two other arrangements for realizing the threshold potential, especially where the INVERTER 11 function is implemented with NAND and NOR gates respectively. Where the oscillator is fabricated in monolithic form it can be expected that device parameters on a single silicon die will be closely matched for similar devices. Accordingly, a threshold potential generated via a feedback connected circuit similar to the circuit performing the function of INVERTER 11 will match the threshold potential of INVERTER 11 very closely.

The circuit of FIG. 4 is a gated oscillator operating on the same concepts as the FIG. 1 circuit. A CMOS inverter 100 comprising serially connected p-type transistor 37 and n-type transistor 38 and having respective input and output connections 46 and 101 respectively is cascaded with NOR circuit 31 to form an astable multivibrator. The multivibrator is conditioned to oscillate in similar fashion to the FIG. 1 circuit by the feedback capacitor 32 connected from the NOR 31 output connection 301 to the CMOS inverter input connection 46, and the timing resistor 33 connected between the inverter 100 input and output connections. Circuit oscillation is inhibited by application of a logic "high" signal to the ENABLE input 35.

P-type transistor 36, serially interposed between the CMOS inverter 100 and supply potential $V_{DD}$ performs as a switch to disconnect the inverter from the $V_{DD}$ supply terminal in the inhibit mode. A threshold potential applied to the connection 46 conditions both inverter transistors 37 and 38 to be partially turned on. With supply $V_{DD}$ disconnected from the INVERTER 100 by transistor 36 the output of the inverter is pulled low by the conduction path through transistor 38. This conditions NOR 31 to change state immediately upon imposition of a "low" ENABLE signal.

INVERTER circuit 110 comprising serially connected p-type transistor 39 and n-type transistor 40 by virtue of its output (drain) to input (gates) feedback connection generates a threshold potential at connection 46 for the condition that serially connected p-type transistor 41 and n-type transistor 42 are conducting. Transistors 41 and 42 are conditioned to conduct concurrently, by inverter 43 energizing the gate electrode 44 of the p-type transistor with the complement of the signal applied to gate electrode 45 of the n-type transistor. A logic "high" ENABLE signal simultaneously inhibits oscillation of the multivibrator and conditions transistors 41 and 42 to conduct, energizing inverter 110 so that it can provide a threshold potential to input 46.

Figure 5:
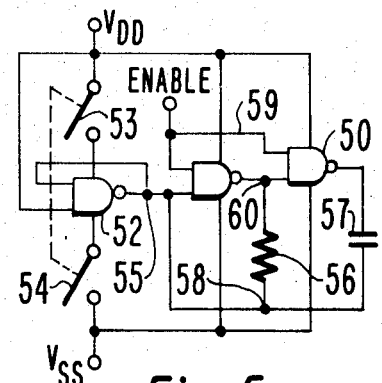

The FIG. 5 circuit is a gated oscillator operating similarly to the FIG. 1 circuit with the inverting functions performed by NAND circuits. Cascade-connected NAND circuits 50 and 51, together with the resistor 56 and capacitor 57 providing feedback, form an astable multivibrator with its period of oscillation determined by the RC time constant of resistor 56 and capacitor 57. Circuit oscillation is inhibited by application of a "low" ENABLE signal at the connection 59. Implementing the inverting function with two-input NAND circuit 51 permits establishing the input 60 to NAND 50 in a "high" state without having to disconnect the $V_{SS}$ supply to the inverting circuit, i.e., to NAND 51. NAND 51 by virtue of its transfer function is conditioned to provide a "high" output at 60 by application of a low ENABLE signal to its input at connection 59. A subsequent "high" ENABLE signal conditions NAND 51 to perform as a simple inverter responsive to potential at its input connection 58.

NAND 52 having a direct connected feedback connection between its output and a first input connection, and having a second input directly connected to the $V_{DD}$ supply emulates the operating conditions of NAND 51. Upon closure of switches 53 and 54 NAND 52 is energized and generates the threshold potential equivalent to the input switching voltage of NAND 51.

Figure 8:
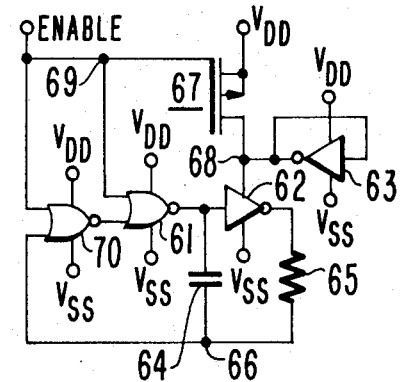
Figure 6:
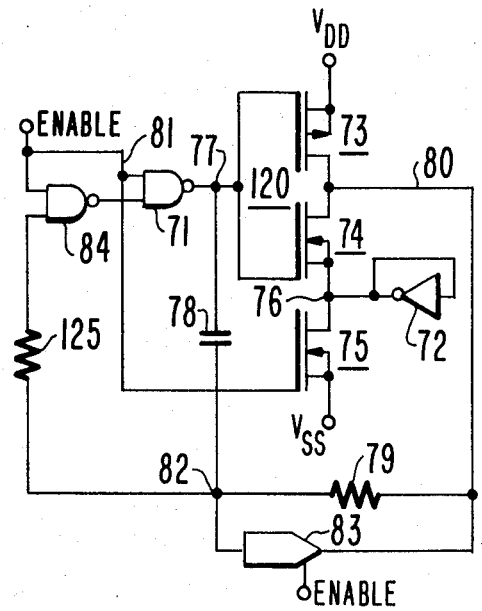

The circuits of FIGS. 6 and 8 form gated oscillators characterized by exhibiting an initial pulse period equal in duration to a steady state pulse period, this being done by establishing a threshold potential at the interconnection of a timing resistor and capacitor through the supply terminal of a complementary output inverter. In FIG. 6 p-type transistor 73 and n-type transistor 74 having their gate electrodes interconnected at connection 77 and their drain electrodes interconnected at connection 80 form a logical INVERTER 120 having an input connection at 77 and an output connection at 80. The source electrode of transistor 73 is connected directly to supply potential $V_{DD}$. The source electrode of transistor 74 is selectively connected to supply potential $V_{SS}$ by the conduction channel of n-type transistor 75. In the oscillatory mode, transistor 75 is conditioned to conduct by an ENABLE or control signal applied to its gate. Transistor 75 is non-conducting during the inhibit mode.

Steady state operation of the circuit proceeds as follows. A transition at the output connection 77 of NAND 71 from a "high" (low) state to a "low" (high) state induces an incremental potential at connection 82 by virtue of capacitor 78 connected between 77 and 82. The potential induced at 82 and applied by resistor 125 to an input of NAND 84 is in such direction to latch the cascade-connected pair of NAND circuits 84 and 71 in the state to which the transition caused it to obtain. The resistor 79 connected between connection 82 and the output 80 of INVERTER 120 provides a discharge path through which node 82 tends to discharge in the direction to cause NAND 84 to change states to upset the latch. NAND 84 switches states after node 82 has decayed to the input threshold potential of NAND 84. The switching of NAND 84 causes NAND 71 to change from the "low" (high) to a "high" (low) state, inducing an increment in potential at node 82 to latch the circuit in this state. The INVERTER 120 with its input connected to the output of NAND 71 complements the potential at the connection 77 and provides that the potential across resistor 79 is of such value to insure capacitor 78 will discharge in the direction to unlatch the combination of NANDS 84 and 71.

The resistor 125 between connection 82 and the input of NAND 84 is incorporated to reduce the effects of the input connection of NAND 84 abruptly clamping the potential at connection 82 when the potential thereat exceeds the supply potentials. This phenomena occurs where the input connections of NAND 84, for example, are provided with input gate protection typical of the family of CMOS digital circuits. Such input protection limits the input signal excursions to the relatively positive and relatively negative supply potentials by diodes connected to the input connections and arranged to conduct for input signals exceeding supply potentials. The resistor 125 does not eliminate the clamping action but it does tend to linearize the operation of the oscillator in the sense that the duty cycle approaches a square wave.

In the inhibit mode NANDs 84 and 71 have a "low" ENABLE signal applied to respective ones of their inputs forcing a "high" at each of their output connections. Upon application of a high ENABLE signal, NAND 71 will immediately change states as a "high" will then be present at both of its input connections. For the circuit biased at its steady-state values during the inhibit period the circuit will begin operating immediately subsequent to this first transition under steady-state conditions and the first pulse duration will equal the steady-state duration.

During the inhibit mode the input 77 to INVERTER 120 is held "high" turning p-type transistor 73 off and n-type transistor 74 on. Concurrently transistor 75 is off. INVERTER 72, having a d-c feedback connection between its input and output nodes, generates a potential at its output 76. INVERTER 72 is arranged to cause this potential to be equivalent to the threshold potential of NAND 84. This potential is translated via the drain-source conduction channel of transistor 74 to output connection 80 and through resistor 79 to connection 82 the more critical point.

INVERTER 72 has a relatively high output impedance to limit its power dissipation and to prevent any undesirable bias at connection 76 for the circuit in the oscillatory mode. The high output impedance of INVERTER 72 limits the recovery time of the circuit, i.e., the time required for node 82 to achieve the threshold potential after inception of the inhibit mode.

A circuit 83 is provided to decrease the recovery time of the circuit. Circuit 83 responsive to the potential at connection 82 and to the ENABLE signal provides a tri-state output including a high output impedance for the connection 82 near threshold potential or the circuit in the oscillatory mode, a "high" output potential for connection 82 having a potential between $V_{SS}$ and a prescribed value less than the threshold potential, or a "low" output potential for connection 82 having a potential between $V_{DD}$ and a prescribed value greater than the threshold potential.

Figure 7:
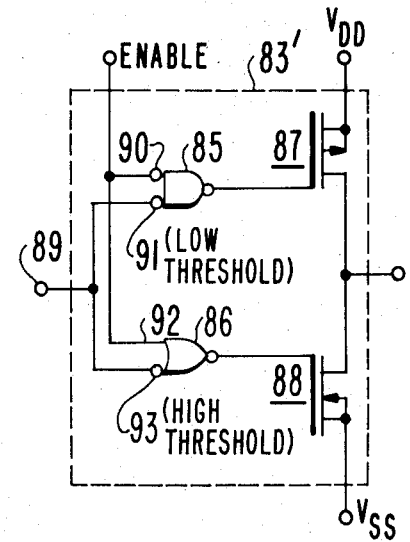
FIG. 7 is a schematic diagram of a fast recovery circuit.

The FIG. 7 circuit illustrates one implementation of the fast recovery circuit 83 of the FIG. 6. The FIG. 7 circuit operates similar to a conventional tri-state logic circuit having a first input connected to receive the enable signal, which input subordinates the second input for a high ENABLE signal. A second input 89 is connected at the inverting input connection 91 of NAND 85 and inverting input connection 93 of NOR 86. NAND 85 has its output connected to the gate electrode of p-type transistor 87 and NOR 86 has its output connected to the gate electrode of n-type transistor 88. For the ENABLE signal "low" a "high" potential at input 89 conditions both NAND 85 and NOR 86 to exhibit "high" output potentials, conditioning n-type transistor 88 to conduct and p-type transistor 87 to be non-conducting. Alternatively, a "low" at input 89 conditions both NAND 85 and NOR 86 to exhibit "low" output potentials, turning the n-type transistor 88 "off" and the p-type transistor 87 "on". The switching potential of the input connection 91 of NAND 85 is arranged to be less than the threshold of NAND 84, while the switching potential of input connection 93 of NOR 86 is arranged to be greater than the threshold of NAND 84. The offset in switching potentials of NAND 85 and NOR 86 ensures that transistors 87 and 88 will not simultaneously conduct. The circuit 83' thus rapidly charges connection 80 through either low-impedance transistor 87 or low-impedance transistor 88 to a potential approaching the threshold potential of NAND 84. Circuit 83' then enters a high impedance state with both transistors "off", and the completion of charging connection 82 to threshold is accomplished by inverter 72.

The operation of the circuit of FIG. 8 is analogous to that of FIG. 6. The primary difference in operation is that the initial output transition and the ENABLE signals required for the FIG. 8 circuit are complementary to those of the FIG. 6 circuit.

What is claimed is:
1. In an oscillator circuit of the type including a plurality of inverting circuits in cascade connection, at least one of which is a two-input LOGIC circuit susceptible of inhibiting oscillation responsive to a prescribed control signal being applied to one of its input connections, including a closed feedback path effected by a capacitor having first and second plates respectively connected between the respective input and output connections of the first and last of the inverting circuits in said cascade connection, and including a resistor connected between the first plate of the capacitor and the output connection of one of the inverting circuits in said cascade connection which is normally in a state complementary to said last inverting circuit, said oscillator alternating between two states responsive to potential at the interconnection of the capacitor and resistor traversing a threshold voltage $V_T$, an improvement for producing an initial oscillatory period after cessation of applied control signal, which initial oscillatory period is of equal duration to the steady state oscillating period, which improvement comprises:

means for generating and applying a potential substantially equal to $V_T$ to the interconnection of the capacitor and resistor whenever oscillation is inhibited, thereby conditioning the oscillator to operate within steady-state potential limits for the initial period; and means for conditioning each of the inverting circuits in said cascade connection to obtain a prescribed state, whenever oscillation is inhibited, to ensure the oscillator will change states immediately after cessation of applied control signal.

2. A selectively enabled, or gated, oscillator comprising:

a first LOGIC circuit having input and output connections; and first and second terminals for applying supply potential therebetween, characterized by changing its state for an input signal excursion through a potential $V_T$;

a second LOGIC circuit having a first input connected for receiving control signal, a second input connected to the output connection of the first LOGIC circuit and characterized by exhibiting an output signal complementary to the control signal for the control signal being in a first logic state, and exhibiting the complement of signal at its second input connection for the control signal being in a second logic state;

a capacitor having a first plate connected to the output connection of the second LOGIC circuit and having a second plate;

a resistor having a first end connected to the output connection of the first LOGIC circuit and a second end connected to the second plate of the capacitor;

means connecting the second plate of the capacitor to the input connection of the first LOGIC circuit;

means for selectively generating a threshold potential $V_T$, which potential is applied to an interconnection between the resistor and capacitor; and switch means for selectively applying supply potential between the first and second terminals of the first LOGIC circuit for the oscillator enabled, and open otherwise, said switch means being arranged so that the output potential of the first LOGIC circuit tends toward the logic state that conditions the second LOGIC circuit to change state immediately subsequent to the control signal obtaining its second logic state.

3. An oscillator as set forth in claim 2 wherein the means for selectively generating a threshold potential $V_T$ comprises:

first and second supply terminals for applying supply potential thereto;

a voltage divider connected between said first and second supply terminals and having an output connection at which the potential $V_T$ is available;

means connecting the output connection of the voltage divider to an interconnection of the resistor and capacitor;

second switch means for selectively connecting the first supply terminal to a relatively positive supply potential only when the oscillator is disabled; and third switch means for selectively connecting the second supply terminal to a relatively negative supply potential only when the oscillator is disabled.

4. An oscillator as set forth in claim 2 wherein the means for selectively generating a threshold potential $V_T$ comprises:

first and second supply terminals for applying supply potential thereto;

a third LOGIC circuit connected for receiving energizing potential from the first and second supply terminals, having input and output connections and characterized by changing its output logic state for an input signal excursion through potential $V_T$;

feedback means connecting the output connection of the third LOGIC circuit to its input connection;

means for connecting the output connection of the third LOGIC circuit to an interconnection between the capacitor and resistor;

second switch means for selectively connecting the first supply terminal to a relatively positive supply potential only when the oscillator is disabled; and third switch means for selectively connecting the second supply terminal to a relatively negative supply potential only when the oscillator is disabled.

5. An oscillator as set forth in claim 4 wherein the third LOGIC circuit comprises an INVERTER.

6. An oscillator as set forth in claims 2, 3 or 4 wherein the first LOGIC circuit comprises an INVERTER.

7. An oscillator as set forth in claims 2, 3 or 4 wherein the second LOGIC circuit comprises a NAND gate.

8. An oscillator as set forth in claims 2, 3 or 4 wherein the second LOGIC circuit comprises a NOR gate.

9. An oscillator as set forth in claims 3 or 4 wherein the first, second and third switch means comprise first, second and third transistors respectively each having a respective principal conduction path and a respective control electrode, the first transistor being connected to apply supply potential via its principal conduction path to at least one of the first and second terminals of the first LOGIC circuit only when the oscillator is enabled in response to a control signal applied to its control electrode, the second and third transistors being respectively connected to apply relatively positive and relatively negative supply potential to the first and second supply terminals respectively via their principal conduction paths when the oscillator is disabled in response to respective control signals applied to their respective control electrodes.

10. A selectively disabled or gated oscillator comprising:

first and second LOGIC circuits having respective first input connections for receiving a control signal, having respective output and second input connections for each characterized by exhibiting an output signal complementary to the control signal for the control signal being in a first logic state, and exhibiting the complement of the signal at its second input for the control signal being in a second logic state;

a capacitor having a first plate connected at the output connection of the second LOGIC circuit and having a second plate;

means connecting the second plate of the capacitor to the second input connection of the first logic circuit;

a resistor connected between the second plate of the capacitor and the output of the first LOGIC circuit;

means connecting the output connection of the first LOGIC circuit to the input connection of the second LOGIC circuit;

means for generating a potential $V_T$, equivalent to the steady-state d.c. potential appearing at the interconnection of the resistor and capacitor; and means for applying the potential $V_T$ to the interconnection of the resistor and capacitor.

11. An oscillator circuit as set forth in claim 10 wherein said first and second logic circuits comprise NAND gates.

12. An oscillator circuit as set forth in claim 10 wherein said first and second logic circuits comprise NOR gates.

13. An oscillator as set forth in claims 10, 11 or 12 wherein the means for generating the potential $V_T$ comprises:

a third LOGIC circuit similar to the first having an output connected to at least one of its input connections and having first and second terminals for applying supply potential thereto; and first and second switch means responsive to the control signal connected for selectively applying supply potential to the first and second terminal respectively, for the oscillator disabled, and open otherwise.

14. An oscillator as set forth in claims 10, 11 or 12 wherein the means for generating the potential $V_T$ comprises:

an INVERTER circuit having an input connected to an output connection thereof and having first and second terminals for applying supply potential thereto; and first and second switch means responsive to the control signal connected for selectively applying supply potential to the first and second terminals respectively, for the oscillator disabled, and open otherwise.

15. A selectively disabled or gated oscillator comprising:

first and second LOGIC circuits each having a first input connection for receiving a control signal each having an output and a second input connection and characterized by exhibiting an output signal state complementary to the control signal for the control signal in a first logic state and exhibiting an output signal complementary to the signal at its second input connection for the control signal in a second logic state;

means for connecting the output connections of the first LOGIC circuit to the input connection of the second LOGIC circuit;

a capacitor having a first plate connected to the output connection of the second LOGIC circuit and having a second plate;

means connecting the second plate of the capacitor to the input connection of the first LOGIC circuit;

an INVERTER circuit having first and second nodes for application of respective relatively positive and relatively negative supply potentials thereto, having an input connected to the output connection of the second LOGIC circuit and having an output connection;

switch means between at least one of the first and second nodes and its associative supply potential for interrupting application of supply potential responsive to said control signal whenever the oscillator is disabled;

a resistor having a first end connected to the output connection of the INVERTER circuit and a second end connected to the second plate of the capacitor, the resistor and capacitor establishing the frequency oscillation;

means for generating a potential $V_T$, substantially equal to the steady state d.c. potential occurring at the interconnection of the resistor and capacitor for the oscillator enabled; and means for applying the potential $V_T$ to the interconnection of one of the first and second nodes and the switch means.

16. An oscillator as set forth in claim 15 wherein the first and second LOGIC circuits comprise first and second NAND gates and wherein the switch means is connected between the relatively negative supply potential and the second node of the INVERTER circuit.

17. An oscillator as set forth in claim 16 wherein the INVERTER comprises a complementary pair of field effect transistors having respective source electrodes arranged for receiving supply potential, drain electrodes connected to the INVERTER output connection and respective gate electrodes connected to the INVERTER input connection; and wherein the switch means comprises an n-channel field effect transistor having a principal conduction path serially connected between the second node of the INVERTER and the relatively negative supply potential.

18. An oscillator as set forth in claim 15 wherein the first and second LOGIC circuits comprise first and second NOR gates and the switch means is connected between the relatively positive supply potential and the first node of the INVERTER circuit.

19. An oscillator as set forth in claim 18 wherein the INVERTER comprises a complementary pair of field effect transistors having respective source electrodes arranged for receiving supply potential, drain electrodes interconnected to the INVERTER output connection and respective gate electrodes connected to the INVERTER input connection; and wherein the switch means comprises a p-channel field effect transistor having a principal conduction path serially connected between the first node of the INVERTER and the relatively positive supply potential.

20. An oscillator as set forth in claims 15, 16 or 18 wherein the means for generating a potential $V_T$ comprises:

a further INVERTER circuit having an input and an output connection interconnected at the node between the INVERTER and switch means.

21. An oscillator as set forth in claims 15, 16 or 18 wherein the means for generating a potential $V_T$ comprises:

a voltage divider connected across the relatively positive and relatively negative supply potential and having an output connected at the node between the INVERTER and switch means.

22. An oscillator as set forth in claim 20 further including a fast recovery circuit responsive to the control signal and the potential at the interconnection of the resistor and capacitor, to initially apply a relatively positive or relatively negative low impedance potential source to the output connection of the INVERTER for charging the second plate of the capacitor to within a prescribed voltage of the steady-state d.c. potential for the oscillator disabled, and exhibiting a relatively high output impedance for the capacitor charged to the prescribed voltage and for the oscillator enabled.

23. In an oscillator circuit of the type including a plurality of inverting circuits in cascade connection, at least one of which is a two-input LOGIC circuit susceptible of inhibiting oscillation responsive to a prescribed control signal being applied to one of its input connections, including a closed feedback path effected by a capacitor having first and second plates respectively connected between the respective input and output connections of the first and last of the inverting circuits in said cascade connection, and including a resistor connected between the first plate of the capacitor and the output connection of one of the inverting circuits in said cascade connection which is normally in a state complementary to said last inverting circuit, said oscillator alternating between two states responsive to potential at the interconnection of the capacitor and resistor traversing a threshold voltage $V_T$, an improvement for producing an initial oscillatory period after cessation of applied control signal, which initial oscillatory period is of equal duration to the steady state oscillating period, which improvement comprises:

means responsive to said prescribed control signal for establishing a potential substantially equal to $V_T$ at the interconnection of the capacitor and resistor whenever oscillation is inhibited, thereby conditioning the oscillator to operate within steady-state potential limits for the initial period; and means for conditioning each of the inverting circuits in said cascade connection to obtain a prescribed state, whenever oscillation is inhibited, to ensure the oscillator will change states immediately after cessation of applied control signal.

* * * * *

UNITED STATES PATENT AND TRADEMARK OFFICE
CERTIFICATE OF CORRECTION

PATENT NO. : 4,286,233
DATED : August 25, 1981
INVENTOR(S) : Nicholas Kucharewski and James Edward Gillberg It is certified that error appears in the above—identified patent and that said Letters Patent is hereby corrected as shown below:

Column 10, line 14, after "frequency" insert --of--.

Signed and Sealed this

Fifth Day of January 1982

[SEAL]

Attest:

GERALD J. MOSSINGHOFF

*Attesting Officer*          *Commissioner of Patents and Trademarks*